US007391201B2

(12) United States Patent
Ji

(10) Patent No.: US 7,391,201 B2
(45) Date of Patent: Jun. 24, 2008

(54) REGULATED ANALOG SWITCH

(75) Inventor: Cang Ji, Kirchheim/Teck-Nabern (DE)

(73) Assignee: Dialog Semiconductor GmbH, Kirchheim/Teck-Nabern (DE)

( * ) Notice: Subject to any disclaimer, the term of this patent is extended or adjusted under 35 U.S.C. 154(b) by 0 days.

(21) Appl. No.: 11/586,193

(22) Filed: Oct. 25, 2006

(65) Prior Publication Data

US 2008/0094044 A1 Apr. 24, 2008

(30) Foreign Application Priority Data

Oct. 23, 2006 (EP) ................................. 06392012

(51) Int. Cl.
*H03H 1/00* (2006.01)
*G05F 5/00* (2006.01)

(52) U.S. Cl. ....................................... 323/368; 323/303

(58) Field of Classification Search ................. 323/368, 323/317, 316, 303, 280
See application file for complete search history.

(56) References Cited

U.S. PATENT DOCUMENTS 4,093,874 A 6/1978 Pollitt
4,543,522 A * 9/1985 Moreau ...................... 323/303
4,792,747 A * 12/1988 Schroeder ................... 323/303
6,518,737 B1 2/2003 Stanescu et al.
7,049,860 B2 5/2006 Gupta
2003/0076157 A1 4/2003 Shu
2003/0227311 A1 12/2003 Ramganethan
2005/0231180 A1 10/2005 Nagata et al.

* cited by examiner

*Primary Examiner*—Shawn Riley
(74) *Attorney, Agent, or Firm*—Saile Ackerman LLC; Stephen B. Ackerman

(57) ABSTRACT

Circuits and methods to achieve a regulated analog switch being capable to provide an output-voltage not exceeding a defined limit are disclosed. In a preferred embodiment a car battery provides a supply voltage up to 40 Volts, wherein a load must not have an output voltage higher than 22 Volts. The drain-source ON-resistance of the switch, realized by a high-voltage MOSFET, is kept to a minimum. The voltage regulation of the preferred embodiment is performed by a single stage operational amplifier and a two-stage amplifier having Miller compensation.

22 Claims, 5 Drawing Sheets

REGULATED ANALOG SWITCH

BACKGROUND OF THE INVENTION (1) Field of the Invention

This invention relates generally to analog switches and relates more particularly to a MOSFET switch used in high-voltage applications up to an order of magnitude of 40 Volts protecting a load of excessive voltage and having a minimal drop voltage when battery voltage is not exceeding a threshold voltage critical to a load.

(2) Description of the Prior Art

MOSFET analog switches use the MOSFET channels as a low on resistance switch to pass analog signals when on and a high impedance node when off. Signals flow in both directions across a MOSFET switch. In this application the drain and source of a MOSFET switch places depending on the voltages of each electrode compared to that of the gate. For a simple MOSFET without an integrated diode, the source is the most negative side compared to the gate of an N-MOS or the most positive side compared to the gate of a P-MOS. All of these switches are limited on what signals they can pass/stop by their gate to source, gate to drain and source to drain voltages, at which time the FETs are damaged.

A Single type MOSFET switch uses a four terminal simple MOSFET of either P or N type. In the case of an N-type switch, the body is connected to GND and the Gate is used as the switch control. Whenever the Gate-Body voltage is above the threshold voltage the MOSFET conducts. The higher the voltage the more the MOSFET conducts until it enters the saturation region. An N-MOS will pass through all negative voltages and all positive voltages less than (Vgate−Vtn), measured with respect to the body. The switches are usually operated in the saturation region so they have a low resistance.

In the case of a P-MOS, the body is connected to Vdd and the gate is brought to a lower potential to turn the switch on. The P-MOS switch passes all voltages higher than the body voltage and all voltages lower than the body voltage, but higher than (Vgate+Vtp), measured with respect to the body.

Especially in automotive applications, batteries as e.g. car batteries provide a broad range of output voltage having a range between 40 Volts or even more and 12 to 10 Volts. Integrated semiconductor circuits used in e.g. automotive applications have a maximum allowable voltage as e.g. 22 Volts. It is a challenge for the designers of such applications to make sure that this maximum allowable voltage is absolutely never exceeded and that these integrated semiconductor circuits get their supply voltage with minimal losses.

Analog semiconductor switches having low $R_{ON}$ resistance can be used to provide supply voltage to integrated circuits switches.

There are more known patents or patent publications dealing with the design of analog switches:

U.S. Patent Application Publication (US 2003/0227311 to Ranganathan) proposes a CMOSFET switch including a NMOSFET, a PMOSFET, an input formed at the connection of the source terminals of the MOSFETs, and an output formed at the connection of the drain terminals of the MOSFETs. At least one of the MOSFETs is characterized by a small magnitude inherent threshold voltage, or the CMOSFET switch has at least one circuit that is capable of reducing a voltage difference between the source and body terminals of a MOSFET, or both. The variations in on resistance can be reduced over a wide common mode range by reducing the threshold voltages of the NMOSFET and the PMOSFET of the CMOSFET switch.

U.S. Pat. No. (7,049,860 to Gupta) discloses a replica network for linearizing switched capacitor circuits. A bridge circuit with a MOSFET resistor disposed in a resistor branch of the bridge circuit is provided. A noninverting terminal of an operational amplifier is connected to a first node of the bridge circuit and an inverting terminal of the operational amplifier is connected to a second node of the bridge circuit. The second node is separated from the first node by another node of the bridge circuit. An output of the operational amplifier is provided to a gate terminal of the MOSFET resistor and to the gate terminal of the MOSFET switch in a switched capacitor circuit, thereby controlling the resistance of the MOSFET switch so that it is independent of the signal voltage. In this manner, the replica network of the present invention linearizes the switched capacitor circuit. In this manner, the replica network of the present invention linearizes the switched capacitor circuit.

U.S. Pat. No. (4,093,874 to Pollit) discloses a compensation circuit connected across the source and gate electrodes of a MOSFET switch providing a compensating voltage across these electrodes such that the value of the ON resistance, $R_{ON}$, from source to drain remains constant despite ambient temperature variations and in the presence of an analog input signal the compensation circuit provides a compensating voltage across these same electrodes such that the value of $R_{ON}$ remains constant despite variations in the amplitude of the input signal.

SUMMARY OF THE INVENTION

A principal object of the present invention is to achieve methods and circuits for a regulated analog switch having an output voltage not exceeding a defined voltage limit A further object of the present invention is to achieve methods and circuits for a regulated analog switch having an output voltage not exceeding a defined voltage limit, wherein the input voltage could be much higher than the defined output voltage.

Another object of the present invention is to achieve methods and circuits for a regulated analog switch having an output voltage not exceeding a defined voltage limit, wherein the input voltage could be higher than 12 Volts.

Another object of the present invention is to achieve methods and circuits for a regulated analog switch having an output voltage not exceeding a defined voltage limit, wherein the output current is constant over a variable input voltage ranging between a order of magnitude of 5 Volts and an order of magnitude of more than 40 Volts.

In accordance with the objects of this invention a method for a regulated analog switch providing a constant output voltage not exceeding a defined voltage limit, wherein an input voltage could be much higher than this defined output voltage limit and wherein the ON-resistance of the switch can be reduced to a minimum, has been achieved. The method invented comprises, first, to provide a supply voltage smaller than the maximum extended drain voltage of said transistor switch, said transistor switch, a voltage divider between said output voltage and ground, a differential amplifying means having its output connected to the gate of said high voltage transistor, a reference voltage being lower than said supply voltage, and a resistive means connected between said supply voltage and the gate of said transistor switch. The following steps comprise to bias said differential amplifying means with said supply voltage, to amplify the difference between the midpoint voltage of said voltage divider and said reference voltage and using the amplified difference to control the gate of said high-voltage transistor, and to minimize the ON-resistance of said high voltage transistor by applying a maximal allowable gate-source voltage to said transistor in case said supply voltage is smaller or equal than said defined output voltage. The last step of the method comprises to clip the output voltage by adjusting said reference voltage and said voltage divider.

In accordance with the objects of this invention a circuit for a regulated analog MOSFET switch providing a constant output voltage not exceeding a defined voltage limit, wherein an input voltage could be much higher than this defined output voltage limit and wherein the ON-resistance of the switch can be reduced to a minimum, has been achieved, The circuit invented is comprising, first, a supply voltage being smaller than the maximum extended drain voltage of said MOSFET switch, a reference voltage being lower than said supply voltage, and a MOSFET transistor used as switch being connected between said supply voltage and said output voltage, wherein its gate is connected to a second terminal of a resistive means and to an output of an differential amplifying means. Furthermore the circuit comprises said resistive means wherein a first terminal is connected to said supply voltage, said differential amplifying means having two inputs, wherein its first input is a midpoint voltage of a voltage divider and its second input is said reference voltage, and said voltage divider comprising resistive means in series connected between said output voltage and ground.

Further in accordance with the objects of this invention a circuit for a regulated analog PMOSFET switch, providing a constant output voltage not exceeding a defined voltage limit wherein a supply voltage could be much higher than this defined output voltage limit and wherein the ON-resistance of the switch can be reduced to a minimum, has been achieved. The circuit invented comprises, first, a supply voltage being smaller than the maximum extended drain voltage of said PMOSFET switch, a reference voltage being lower than said supply voltage, and a PMOSFET transistor used as switch being connected between said supply voltage and said output voltage, wherein its gate is connected to a second terminal of a first resistive means and to an output of a differential operational amplifier. Furthermore the circuit comprises said first resistive means wherein a first terminal is connected to said supply voltage, said differential operational amplifier having two inputs, wherein its first input is a midpoint voltage of a first voltage divider and its second input is a midpoint of a second voltage divider, said first voltage divider comprising resistive means in series connected between said constant output voltage of the circuit and ground, said second voltage divider comprising resistive means in series connected between said reference voltage and ground, and a means to isolate transistors of said differential operational from said supply voltage. More over the circuit comprises a two-stage Miller compensated amplifier connected between said reference voltage and ground, having an input stage and an output stage, wherein the input stage has two inputs, wherein a first input is a mid-point voltage of said second voltage divider and a second input is the voltage at a second terminal of a sense resistive means, wherein the output stage of said Miller compensated amplifier is used for Miller compensation, is driving a current through said sense resistive means and controls a gate voltage of a first current mirror. Finally the circuit comprises said sense resistive means being connected between said reference voltage and said output stage of said Miller compensated amplifier, said first current mirror comprising two transistors having their gates connected, wherein a first transistor is the output stage of said Miller compensated amplifier and a second transistor controls the output drain currents of said operational amplifier, and passive devices for Miller compensation connected between the gates of said first current mirrors and said second terminal of said sense resistive means.

BRIEF DESCRIPTION OF THE DRAWINGS

In the accompanying drawings forming a material part of this description, there is shown.

DESCRIPTION OF THE PREFERRED EMBODIMENTS

The preferred embodiments disclose methods and circuits for regulated analog switches to ensure that a supply voltage of a load as e.g. an integrated semiconductor circuit is constant and never exceeds a maximum allowable voltage even in case of a maximum load current. In case a battery voltage is equal or lower than this maximum allowable voltage, the supply voltage of the load is provided with a minimum loss.

Figure 1:
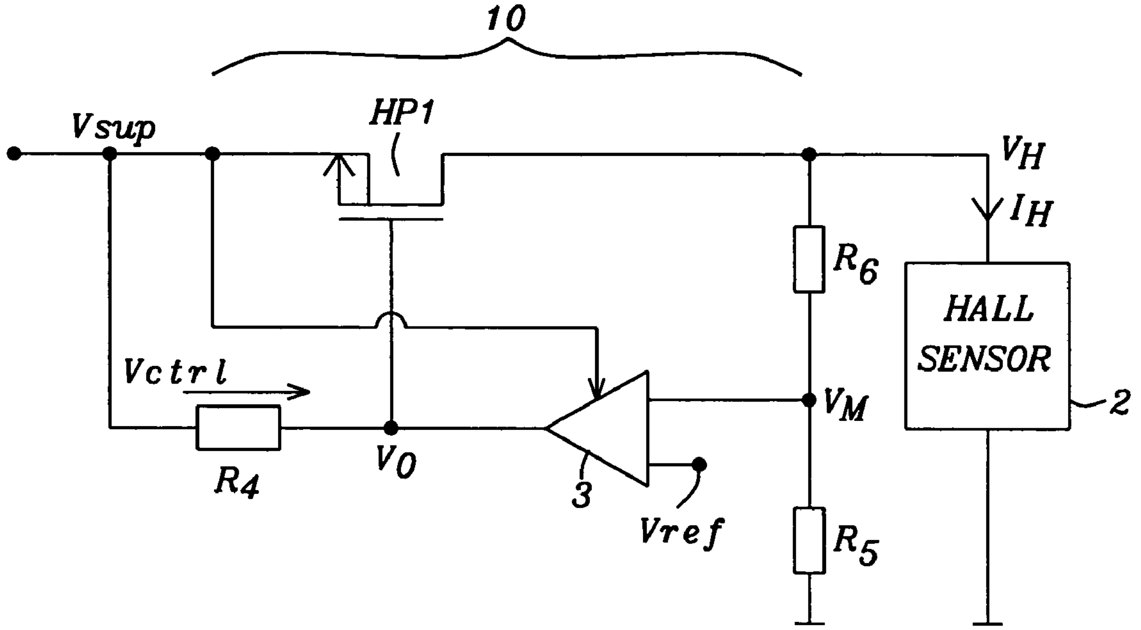
FIG. 1 shows a schematic block diagram of the regulated analog switch invented.

FIG. 1 shows a schematic illustration of a preferred embodiment of the present invention. It has to be understood that FIG. 1 shows a non-limiting example only of the regulated switch 10 invented. A car battery provides a supply voltage $V_{SUP}$. This supply voltage $V_{SUP}$ is not constant at all and can have a maximum voltage of 40-60 Volts. In a preferred embodiment a Hall sensor ASIC 2 has a maximum allowable voltage $V_H$ of 22 Volts and this voltage has to be kept constant. This means that the gate-source voltage of transistor $HP_1$ of the regulated switch 10 has to be regulated to achieve a constant voltage $V_H$. In a preferred embodiment a high-voltage P-type MOSFET is deployed for this transistor $HP_1$.

Using alternatively a high-voltage N-type MOSFET as switching transistor is also possible but this alternative has some major disadvantages In case of an N-type switch, the body of the N-type transistor has to be connected to GND instead to the source of the N-type switch. Therefore the voltage on the source of the N-type switch is limited by maximum operating voltage on the body-source voltage, which is about the same voltage as on the gate-source of 5 V. That means when the N-type switch is used, the output voltage (source voltage of the N-type Switch) must be lower than 5 V. Other limitation of the N-type transistor is that the source voltage is less than the gate voltage Vsource=Vgate−Vtn. Therefore a P-type MOSFET is a preferred embodiment for the switching transistor.

In case the battery voltage is lower than or close to 22 Volts the drain-source resistance $R_{DSON}$ has to be minimized. Furthermore the output voltage of the circuit has to be constant also in case of maximum load current $I_H$.

A voltage divider comprising resistors $R_6$ and $R_5$ is used to measure the output voltage $V_H$ of the regulated switch 10. Any other resistive means could be used as well for the voltage divider. The voltage $V_M$ of the midpoint of the voltage divider $R_6/R_5$ is first input of a differential amplifier 3. A reference voltage $V_{REF}$ is a second input of amplifier 3. The battery voltage $V_{SUP}$ is used as bias voltage of amplifier 3. The output of amplifier 3 controls the gate of MOSFET transistor $HP_1$. Furthermore the gate of MOSFET $HP_1$ is connected to battery voltage $V_{SUP}$ via resistor $R_4$. Any other resistive means could be used as well for $R_4$. The gate-source voltage of MOSFET transistor $HP_1$ is defined by the voltage drop $V_{ctrl}$ across $R_4$. In case battery voltage $V_{SUP}$ is lower than or close to 22V the gate-source voltage Vctrl is kept to the maximum voltage allowed in order to minimize the drain-source resistance $R_{DS\ (ON)}$ of transistor $HP_1$. The ON-resistance follows the equation:

$$R_{DS(ON)} = \frac{V_{DS}}{I_D} = \frac{L}{\mu C_{ox} W (V_{GS} - |V_{TH}|)},$$

wherein μ is the charge carrier mobility, W is the gate width, L is the gate length, Cox is the gate oxide capacitance per unit area, $V_{GS}$ is the gate-source voltage, and $V_{TH}$ is the threshold voltage of the transistor. From this equation it is clear that $V_{GS}$ should be kept to an allowable maximum in order to achieve a minimal ON-resistance.

Figure 2:
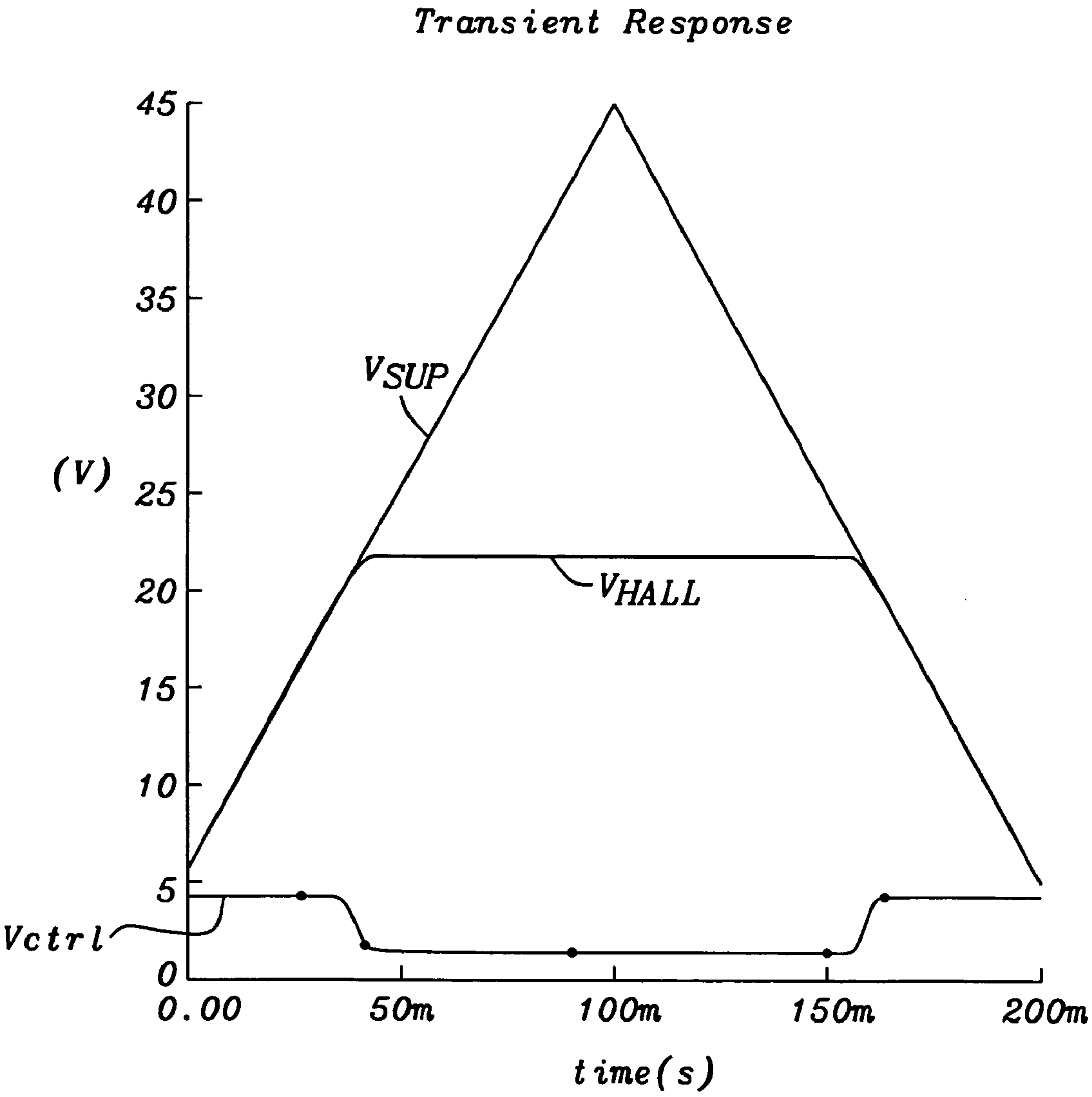
FIG. 2 shows the transient response of the output voltage $V_H$ of the regulated switch of the present invention and of the gate-source voltage Vctrl to changes of the battery supply voltage $V_{SUP}$
Figure 3:
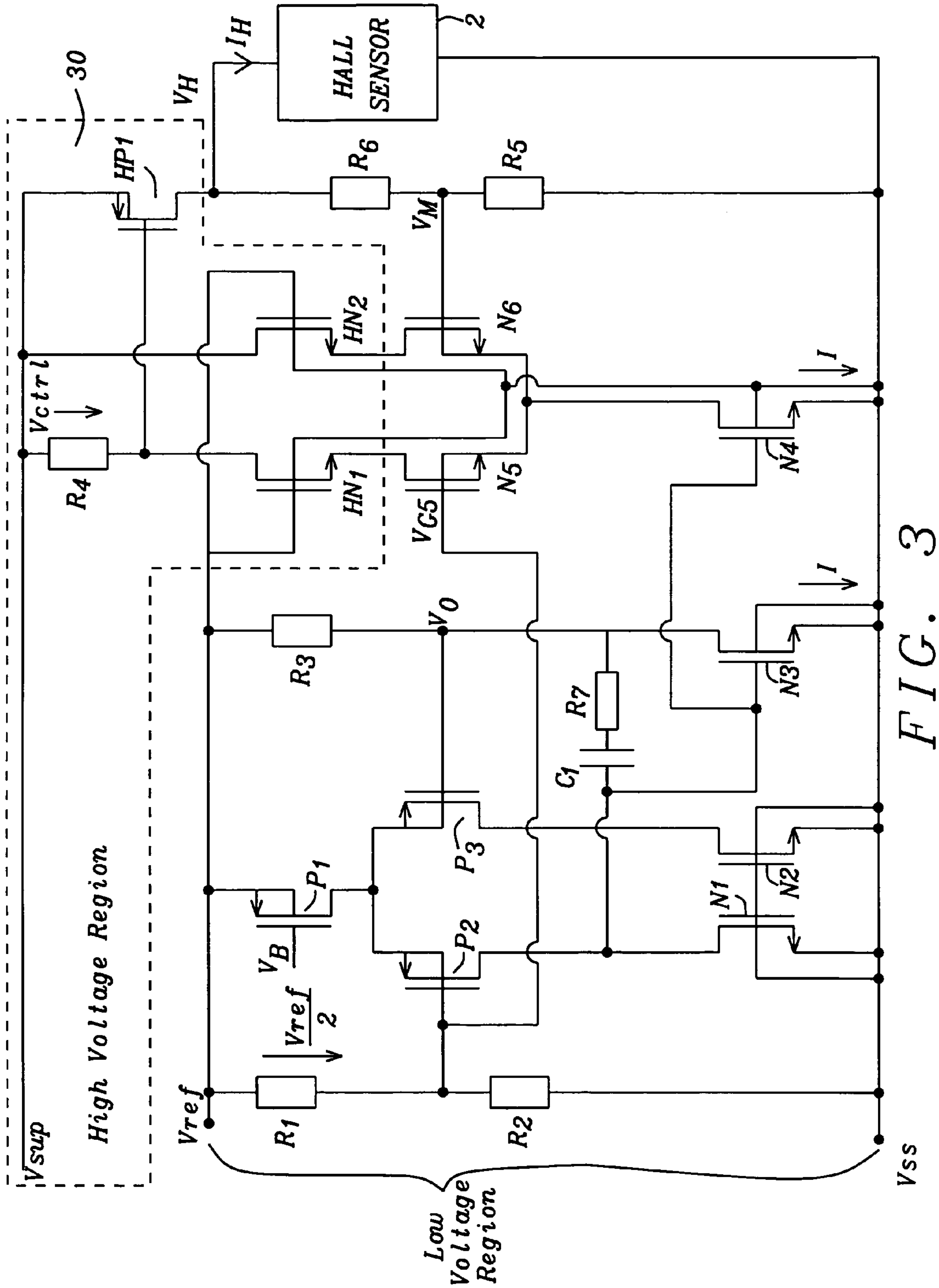
FIG. 3 shows a detailed circuit diagram of a preferred embodiment of the regulated analog switch invented.
Figure 4:
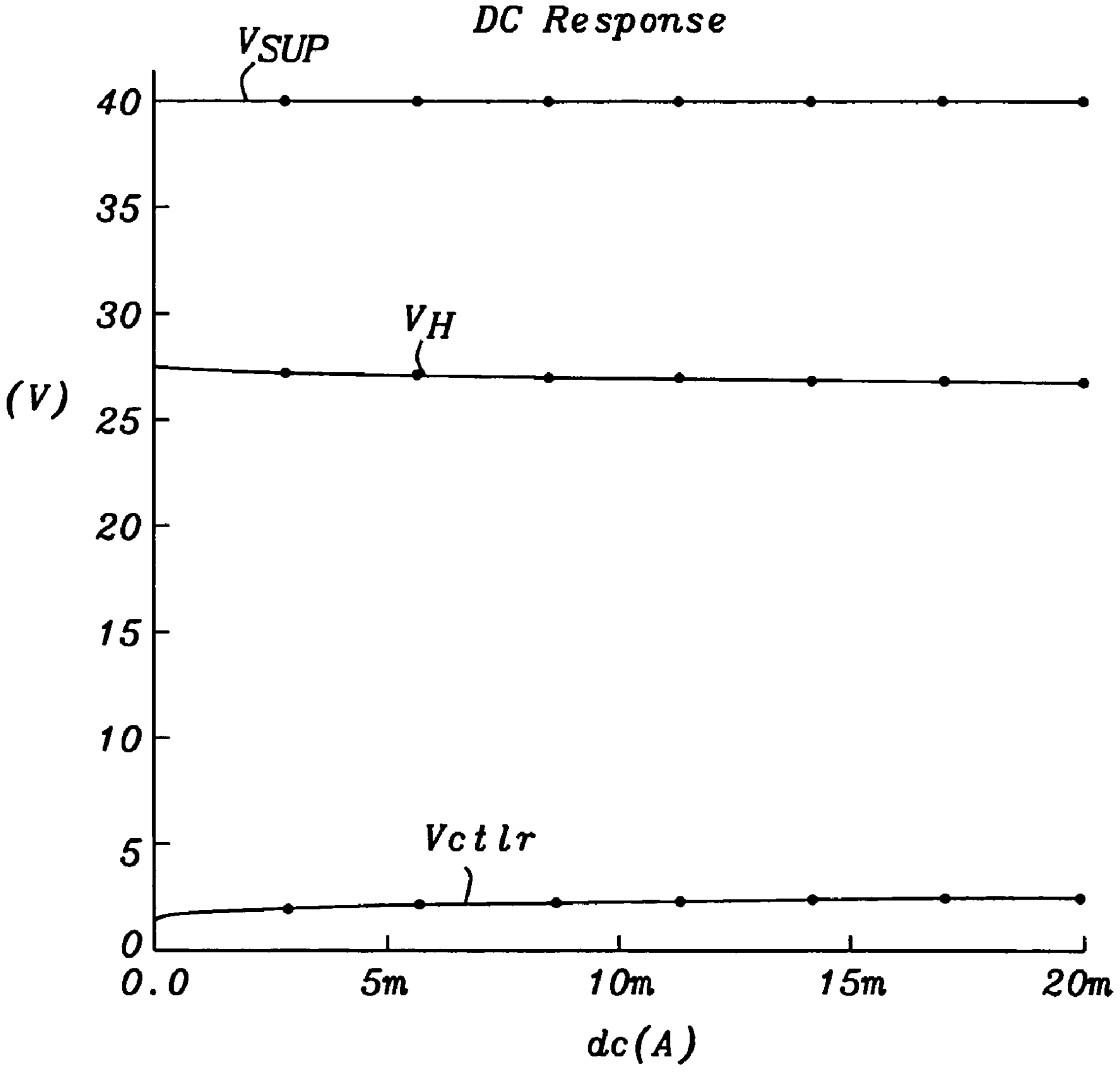
FIG. 4 shows the DC response of the regulated switch invented in case of a high voltage supply (40 Volts) of the car battery.

FIG. 2 shows the transient response of the output voltage $V_H$ of the regulated switch of the present invention and of the gate-source voltage Vctrl to changes of the battery supply voltage $V_{SUP}$. Once the maximum allowable voltage, i.e. 22 Volts, of the Hall sensor ASIC is reached. The gate-source voltage Vctrl is reduced in a way to regulate the output voltage $V_H$ on a constant level of the maximum allowable voltage. It is obvious that said threshold voltage of 22 Volts is a non-limiting example only. The circuit invented could be used for any other threshold voltage required by a load. The threshold voltage could be easily adjusted to other threshold voltages by changing the voltage divider R6/R5 and the reference voltage $V_{REF}$ FIG. 4 shows the DC response of the regulated switch invented in case of a high voltage supply (40 Volts) of the car battery. It demonstrates a constant output voltage $V_H$ even with an output current $I_H$ changing in a broad range. The source-gate voltage $V_{ctrl}$ of MOSFET HP1 is on a relatively low level to keep the output voltage on a level desired (22 Volts), FIG. 3 shows a more detailed circuit diagram of a preferred embodiment of the circuit of a regulated analog switch 10 invented. In this preferred embodiment the reference voltage $V_{ref}$ is 5 Volts. This is of course a non-limiting example. Other reference voltages are possible as well. The output current $I_H$ through a Hall sensor ASIC 2 is constant if the voltage $V_{SUP}$ is in a range between 5.5 Volts to 40 Volts. The area 30 encircled by a dotted line illustrates a "high-voltage" region; this means the transistors HP1, HN1, and HN2 in this area must have an allowable voltage up to 40 Volts. All the other transistors of the circuit shown are in a low voltage region, i.e. the maximum allowable voltage in the preferred embodiment shown is $V_{ref}$, which is 5 Volts. This value of $V_{ref}$ is a non-limiting example; $V_{ref}$ could be in the order of magnitude of e.g. below 6 Volts.

The voltage divider R5/R6, shown already in FIG. 1, follows the equation:

$$R_6 = (m^{-1}) \times R,$$

wherein resistors $R_1$, $R_2$, $R_3$ and $R_5$ have a same standard resistance R. Resistor $R_4$ has a resistance of $R_4 = 2 \times R$.

Instead of these resistors other resistive means, as e.g. transistors could be used as well.

Furthermore the following equation is valid $$m - 1 = \frac{V_H}{0.5 \times V_{ref}} = \frac{R_6 + R_5}{R_5}.$$

This means any output voltage $V_H$ can be defined by following equation:

$$V_H = (m-1)\frac{V_{REF}}{2} = \frac{R_6 + R_5}{R_5} \times \frac{V_{REF}}{2}$$

This equation shows that using the regulated switch of the present invention the output voltage can be varied using different voltage divider relations and/or a different reference voltage.

As already indicated in FIG. 1 the voltage drop $V_{ctlr}$ at resistor $R_4$ amounts to $V_{ctlr}$<Vref. In the preferred embodiment shown $V_{ref}$ is the maximum allowable gate-source voltage of transistor HP1. This means if $V_{ctlr}$ equals $V_{ref}$ the ON-resistance of HP1 is at its minimum.

The midpoint voltage $V_M$ of voltage divider R6/R5, representing output voltage $V_H$, is a first input of a single-stage operational amplifier. This voltage $V_M$ controls the gate of transistor N6. A second input of this operational amplifier is the reference voltage $V_{ref}$ divided by R1/R2. The high voltage transistors HN1 and HN2 are used as level shifter to isolate the source voltage from the drain voltage. Their source voltage is limited to $V_{ref}$–$V_{THN}$ because the gates of transistors HN1 and HN2 are connected to $V_{ref}$. The battery voltage $V_{SUP}$ is biasing the single stage operational amplifier. $V_{SUP}$ is connected to the drain of high voltage transistor HN2.

As shown in FIG. 3, a two-stage Miller compensated amplifier comprises transistors P1, P2, P3, N1, N2, NMOS current mirror transistor N3, and sense resistor R3. Capacitor C1 and resistor R7 compensate the two-pole frequency domain at the voltage port $V_B$. This two-stage amplifier controls the gate voltage of the NMOS current mirror N3/N4. Transistor N3 is used for Miller compensation, and serves as output stage, as driver for the sense resistor R3, and as input transistor for the NMOS current mirror N3/N4. Transistor N4 has the same channel width W and the same channel length L as N3 and is matched to N3. Sense resistor R3 is composed with same material as the reference resistors R1 and R2. The voltage drop along R3 is compared with a bandgap based reference voltage $V_{REF}$ divided by R1 and R2. That way, a constant current I is achieved, merely depending on the reference voltage $V_{REF}$ and absolute values of the resistors R1, R2, and R3 as $$I = V_{REF} * \frac{R_1}{R_1 + R_2} * \frac{1}{R_3}$$

The constant current I is used for charging the gate voltage of the P-type switch HP1.

Transistors N4, N5, N6, R4 build said single-stage operational amplifier, where N4 delivers the bias current I and N5, N6 are input transistors and regulate the output drain currents of transistors N5 and N6 according to the equation $$I_{D5}+I_{D6}=I.$$

N-type high voltage transistors HN1 and HN2 isolate the drains of N5 and N6 from the high voltage $V_{SUP}$. The input gate voltage of N5 has a constant value:

$$V_{G5}=V_{REF}\times\frac{R_1}{R_1+R_2}$$

The input gate voltage $V_M$ of transistor N6 is connected to the $V_H$ feedback voltage according to the equation $$V_M=V_H\times\frac{R_5}{R_5+R_6}.$$

There are different modes of operation:

1. In case $V_H \times R5/(R5+R6) < V_{REF} \times R1/(R1+R2)$ transistor N6 regulates its drain current $I_{D6}$ to 0, and $I_{D5}=I$. The control voltage $V_{CTRL}$ of the P-type switch HP1 has a constant value:

$$V_{CTRL}=I_{D5}\times R_4=V_{REF}\times\frac{R_1}{R_1+R_2}\times\frac{1}{R_3}\times R_4=C\times V_{REF}.$$

Control voltage $V_{CTRL}$ depends only on the reference voltage $V_{REF}$ and a constant C, which depends on the relative ratio of the resistors R1 and R2.

In this way, the gate control voltage $V_{CTRL}$ of the P-type switch HP1 can be easy scaled to the maximum allowed gate-source operating voltage, independent from the temperature and process parameters deviation, to achieve the minimum $R_{DS(ON)\_min}$ of the P-type switch by given transistor area (=width*length). In a preferred embodiment resistors R1=R2=R3=R, R4=2*R and $V_{REF}$=5V. In this case, then the above-mentioned constant C has a value of 1 and the gate control voltage $V_{CTRL}=V_{REF}$=5 V.

The output voltage of the P-type switch HP1 is then $$V_H=V_{SUP}-I_H\times R_{DS(ON)\_min}.$$

2. In case $V_H \times R5/(R5+R6) >= V_{REF} \times R1/(R1+R2)$ transistor N6 regulates its drain current $I_{D6}$, therefore controls the gate voltage $V_{CTRL}=R4\times[I-I_{D6}]$ of the P-type switch so that the difference voltages of the gate of N5 and N6 becomes zero as $$V_H\times R5/(R5+R6)-V_{REF}\times R1/(R1+R2)=0.$$

The output voltage of the P-type switch HP1 will have a constant value of $$V_H=V_{REF}\times\frac{R_1}{R_1+R_2}\times\frac{R_5+R_6}{R_5}.$$

The reference voltage $V_{REF}$ shown in the FIG. 3 is used to supply the miller-compensated amplifier built using low voltage CMOS transistors, therefore the $V_{REF}$ has be higher than $(|V_{THP}|+V_{THN})$ and smaller than the maximum allowed operating voltage of the low voltage CMOS transistors, to make sure that the low voltage amplifier works correct.

The battery voltage $V_{SUP}$ should be higher or equal the maximum allowed gate-source voltage of the P-type transistor HP1, in a preferred embodiment e.g. 5 V, and has to be smaller than the maximum extended drain high voltage of the P-type transistor HP1, in a preferred embodiment e.g. 65 Volts. It has to be understood these values of $V_{REF}$ and $V_{SUP}$ are non-limiting examples and can vary significantly according to the types of transistors used.

Figure 5:
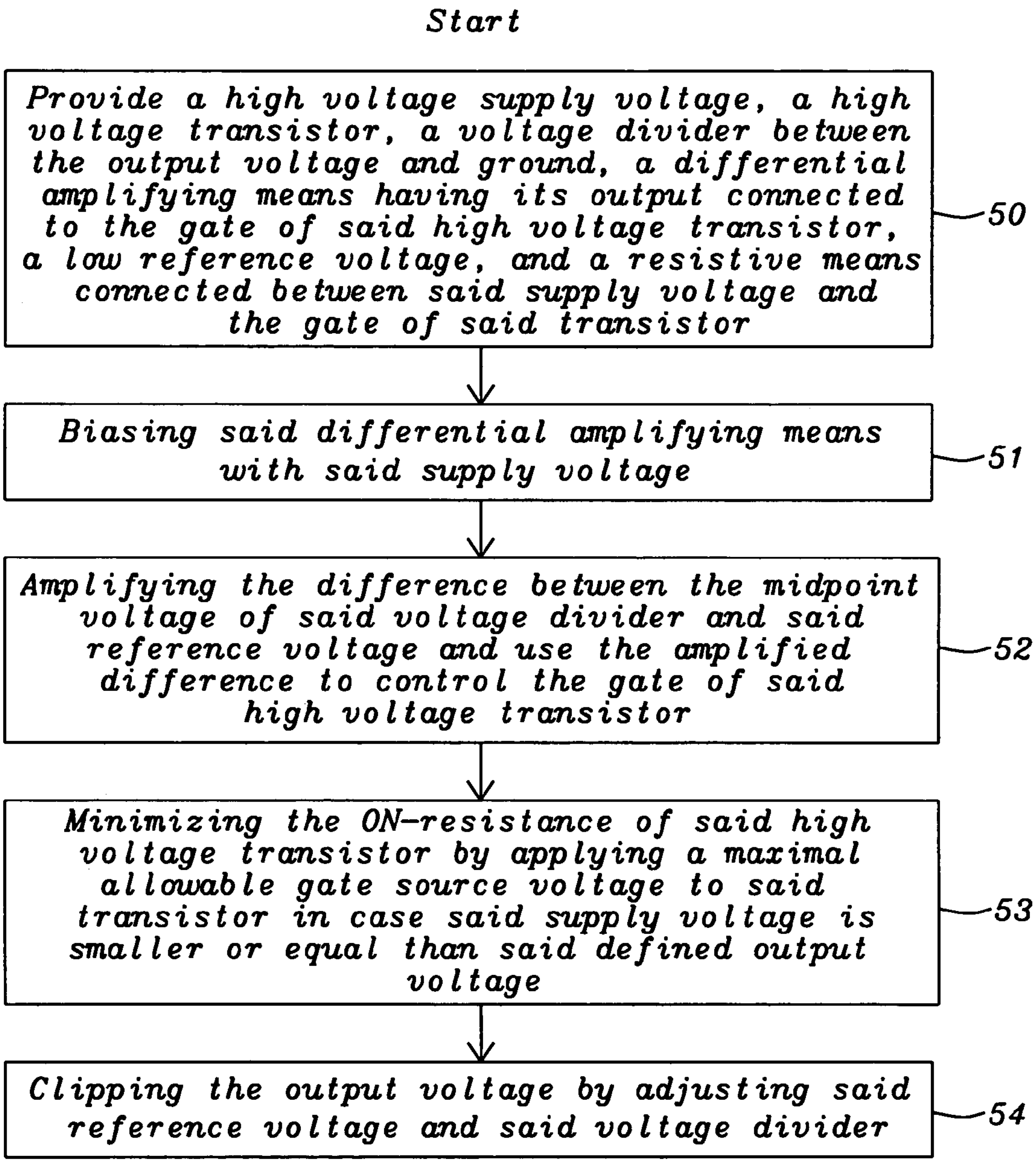
FIG. 5 shows a flowchart of a method to achieve a regulated analog switch providing a constant output voltage not exceeding a defined voltage limit, and a constant output current, wherein an input voltage could be much higher than this defined voltage limit.

FIG. 5 shows a flowchart of a method to achieve a regulated analog switch providing a constant output voltage not exceeding a defined voltage limit, and a constant output current, wherein an input voltage could be much higher than this defined voltage limit and the ON-resistance of the switch can be reduced to a minimum. Step 50 of the method invented illustrates the provision of a high voltage supply voltage, a high voltage transistor, a voltage divider between the output voltage and ground, a differential amplifying means having its output connected to the gate of said high voltage transistor, a low reference voltage, and a resistive means connected between said supply voltage and the gate of said transistor. The next step 51 describes the biasing of said differential amplifying means with said supply voltage and the following step 52 illustrates an amplification of the difference between the midpoint voltage of said voltage divider and said reference voltage and using the amplified difference to control the gate of said high-voltage transistor. Step 53 describes a minimization of the ON-resistance of said high voltage transistor by applying a maximal allowable gate source voltage to said transistor in case said supply voltage is smaller or equal than the output voltage. The last step 54 illustrates the clipping of the output voltage by adjusting said reference voltage and said voltage divider.

While the invention has been particularly shown and described with reference to the preferred embodiments thereof, it will be understood by those skilled in the art that various changes in form and details may be made without departing from the spirit and scope of the invention.

What is claimed is:

1. A method to achieve a regulated analog transistor switch providing a constant output voltage not exceeding a defined voltage limit, wherein a supply voltage could be much higher than this defined output voltage limit and wherein the ON-resistance of the transistor switch can be reduced to a minimum is comprising:

providing a supply voltage being smaller than the maximum extended drain voltage of said transistor switch, said transistor switch, a voltage divider between said output voltage and ground, a differential amplifying means having its output connected to the gate of said transistor switch, a reference voltage being lower than said supply voltage, and a resistive means connected between said supply voltage and the gate of said transistor switch;

biasing of said differential amplifying means with said supply voltage;

amplifying the difference between the midpoint voltage of said voltage divider and said reference voltage and using the amplified difference to control the gate of said transistor switch;

minimizing the ON-resistance of said high voltage transistor by applying a constant maximum allowed gate-source voltage to said transistor switch in case said supply voltage is smaller or equal than said defined output voltage; and clipping of the output voltage by adjusting said reference voltage and said voltage divider.

2. The method of claim 1 wherein said amplifying means is an operational amplifier.

3. The method of claim 1 wherein said amplifying means comprise a single stage operational amplifier and a two-stage amplifier having Miller compensation.

4. The method of claim 1 wherein said output voltage $V_H$ is defined by the equation $$V_H = \frac{R_6 + R_5}{R_5} \times \frac{V_{REF}}{2},$$

wherein $R_6$ is the resistance of a first resistive means of said voltage divider, $R_5$ is the resistance of a second resistive means of said voltage divider and $V_{REF}$ is said reference voltage.

5. The method of claim 1 wherein said biasing is performed by transistors isolating said amplifying means from said supply voltage.

6. The method of claim 1 wherein said transistor switch is a MOSFET switch.

7. The method of claim 6 wherein said MOSFET switch is of PMOSFET type.

8. A circuit for a regulated analog MOSFET switch providing a constant output voltage not exceeding a defined voltage limit wherein a supply voltage could be much higher than this defined output voltage limit and wherein the ON-resistance of the switch can be reduced to a minimum is comprising:

a supply voltage being smaller than the maximum extended drain voltage of said MOSFET switch;

a reference voltage being lower than said supply voltage;

a MOSFET transistor used as switch being connected between said supply voltage and said output voltage, wherein its gate is connected to a second terminal of a first resistive means and to an output of a differential amplifying means;

said first resistive means wherein a first terminal is connected to said supply voltage;

said differential amplifying means having two inputs, wherein its first input is a midpoint voltage of a voltage divider and its second input is said reference voltage; and said voltage divider comprising resistive means in series connected between said output voltage and ground.

9. The circuit of claim 8 wherein said amplifying means comprise an operational amplifier.

10. The circuit of claim 8 wherein said resistive means between the supply voltage and the gate of said transistor is a resistor.

11. The circuit of claim 8 wherein said resistive means of said voltage divider are resistors.

12. The circuit of claim 8 wherein said output voltage $V_H$ is defined by the equation $$V_H = \frac{R_6 + R_5}{R_5} \times \frac{V_{REF}}{2},$$

wherein $R_6$ is the resistance of a first resistive means of said voltage divider, $R_5$ is the resistance of a second resistive means of said voltage divider and $V_{REF}$ is said reference voltage.

13. A circuit for a regulated analog PMOSFET switch providing a constant output voltage not exceeding a defined voltage limit wherein a supply voltage could be much higher than this defined output voltage limit and wherein the ON-resistance of the switch can be reduced to a minimum is comprising:

a supply voltage being smaller than the maximum extended drain voltage of said PMOSFET switch;

a reference voltage being lower than said supply voltage;

a PMOSFET transistor used as switch being connected between said supply voltage and said output voltage, wherein its gate is connected to a second terminal of a first resistive means and to an output of a differential operational amplifier;

said first resistive means wherein a first terminal is connected to said supply voltage;

said differential operational amplifier having two inputs, wherein its first input is a midpoint voltage of a first voltage divider and its second input is a midpoint of a second voltage divider;

said first voltage divider comprising resistive means in series connected between said constant output voltage of the circuit and ground;

said second voltage divider comprising resistive means in series connected between said reference voltage and ground;

a means to isolate transistors of said differential operational from said supply voltage;

a two stage Miller compensated amplifier connected between said reference voltage and ground, having an input stage and an output stage, wherein the input stage has two inputs, wherein a first input is a mid-point voltage of said second voltage divider and a second input is the voltage at a second terminal of a sense resistive means, wherein the output stage of said Miller compensated amplifier is used for Miller compensation, is driving a current through said sense resistive means and controls a gate voltage of a first current mirror;

said sense resistive means being connected between said reference voltage and said output stage of said Miller compensated amplifier;

said first current mirror comprising two transistors having their gates connected, wherein a first transistor is the output stage of said Miller compensated amplifier and a second transistor controls the output drain currents of said operational amplifier; and passive devices for Miller compensation connected between the gates of said first current mirrors and said second terminal of said sense resistive means.

14. The circuit of claim 13 wherein said reference voltage is a bandgap reference voltage.

15. The circuit of claim 13 wherein said first means is a resistor.

16. The circuit of claim 13 wherein said differential operational amplifier comprises is a single stage operational comprising three NMOS transistors, wherein the source of a first transistor is connected to ground, its gate is connected to the gate of said output transistor of said output stage of a Miller compensated amplifier and its drain is connected to both sources of a second and third NMOS transistor, wherein a gate of the second NMOS transistor is connected said first input of the operational amplifier, a gate of the third NMOS transistor is connected to said second input of the operational amplifier and both drains of the second and third transistor are connected to said means to isolate both transistors from said supply voltage.

17. The circuit of claim 13 wherein said supply voltage is a battery voltage up to 65 Volts.

18. The circuit of claim 13 wherein said means to isolate transistors of said differential operational from said supply voltage is comprising two NMOS transistors, wherein the gates of both transistors are connected to said reference voltage, the source of a first transistor is connected to the drain of said second transistor of said operational amplifier, the drain of the first transistor of said means is connected to the supply voltage and the drain of the second transistor is connected to the gate of said PMOSFET switch and to said second terminal of said first resistive means.

19. The circuit of claim 13 wherein said resistive means of the first and second voltage dividers are resistors.

20. The circuit of claim 13 wherein said two-stage Miller compensated amplifier is comprising:

a pair of two NMOS transistors, forming a current mirror, having both gates connected and both sources connected to ground, the drain of a first NMOS transistor is connected to the drain of a second PMOS transistor, to a gate of a NMOS transistor of the output stage and to a first terminal of said passive devices for Miller compensation, and the drain of a second NMOS transistor is connected to a drain of a third PMOS transistor;

a first PMOS transistor having its source connected to said reference voltage, its gate to an output terminal and its drain connected to the sources of said second and third PMOS transistor;

said second PMOS transistor having its gate connected to a midpoint of said second voltage divider;

said third PMOS transistor having its gate connected to a drain of a third NMOS transistor;

said third NMOS transistor, being the output stage of said two-stage amplifier, having its source connected to ground and its gate is connected to a gate of said second transistor of said first current mirror controlling the output drain currents of said operational amplifier.

21. The circuit of claim 20 wherein said passive devices for Miller compensation are a capacitor and a resistor connected in series.

22. The circuit of claim 20 wherein said sense resistive means is a resistor.

* * * * *